United States Patent
Cho et al.

(10) Patent No.: US 7,419,881 B2
(45) Date of Patent: Sep. 2, 2008

(54) PHASE CHANGEABLE MEMORY DEVICE AND METHOD OF FORMATION THEREOF

(75) Inventors: Byeong-Ok Cho, Seoul (KR); Suk-Ho Joo, Seoul (KR); Kyung-Chang Ryoo, Seongnam-si (KR); Kyung-Rae Byun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 375 days.

(21) Appl. No.: 11/252,807

(22) Filed: Oct. 18, 2005

(65) Prior Publication Data

US 2006/0110888 A1 May 25, 2006

(30) Foreign Application Priority Data

Oct. 19, 2004 (KR) .................. 10-2004-0083690

(51) Int. Cl.
*H01L 21/20* (2006.01)
(52) U.S. Cl. ............... 438/385; 438/381; 438/383; 438/384
(58) Field of Classification Search ......... 438/381–385
See application file for complete search history.

(56) References Cited

U.S. PATENT DOCUMENTS

| | | | | |
|---|---|---|---|---|
| 6,764,894 B2 * | 7/2004 | Lowrey | ............. | 438/238 |
| 2002/0017701 A1 * | 2/2002 | Klersy et al. | ............. | 257/536 |
| 2003/0116794 A1 | 6/2003 | Lowrey | ............. | 257/296 |
| 2003/0209746 A1 * | 11/2003 | Horii | ............. | 257/295 |
| 2004/0087074 A1 | 5/2004 | Hwang et al. | ............. | 438/198 |
| 2004/0183107 A1 * | 9/2004 | Horii et al. | ............. | 257/257 |
| 2004/0195604 A1 * | 10/2004 | Hwang et al. | ............. | 257/295 |
| 2005/0110983 A1 * | 5/2005 | Jeong et al. | ............. | 356/148 |
| 2005/0130414 A1 * | 6/2005 | Choi et al. | ............. | 438/672 |

FOREIGN PATENT DOCUMENTS

| | | |
|---|---|---|
| JP | 2004-158854 | 6/2004 |
| KR | 10-2004-0032955 | 4/2004 |
| KR | 10-2004-0038421 | 5/2004 |
| KR | 10-2004-0047272 | 6/2004 |

* cited by examiner

*Primary Examiner*—Zandra Smith
*Assistant Examiner*—Telly D Green
(74) *Attorney, Agent, or Firm*—Mills & Onello LLP

(57) ABSTRACT

In a phase changeable memory device and a method of formation thereof, the phase changeable memory device comprises: a lower electrode pattern on an interlayer insulating layer; an insulating pattern located on the lower electrode pattern; a phase changeable pattern penetrating the insulating pattern and the lower electrode pattern to contact the lower electrode pattern and the interlayer insulating layer; and an upper electrode on the phase changeable pattern.

20 Claims, 8 Drawing Sheets

PHASE CHANGEABLE MEMORY DEVICE AND METHOD OF FORMATION THEREOF

CROSS-REFERENCE TO RELATED APPLICATIONS

This U.S. non-provisional patent application claims priority under 35 U.S.C. § 119 of Korean Patent Application 10-2004-0083690 filed on Oct. 19, 2004, the entire contents of which are incorporated herein by reference.

BACKGROUND OF THE INVENTION

The present invention relates to a non-volatile memory device and a method thereof, and more particularly, to a phase changeable memory device and a method of formation thereof.

Non-volatile memory devices share a common characteristic in that they retain stored data even though the power supply is interrupted. Contemporary non-volatile memory devices commonly employ flash memory cells having a stacked gate structure. The stacked gate structure includes a tunnel oxide layer, a floating gate, a gate interlayer dielectric layer and a control gate electrode, which are sequentially stacked. In order to improve reliability of the flash memory cells and programming efficiency, the characteristics of the tunnel oxide layer should be improved and the coupling ratio of the cell should be increased.

To improve upon the characteristics of conventional flash memory devices, new flash memory device architectures, such as phase changeable memory devices, have been suggested. The phase changeable memory devices can perform the functions of programming and reading by changing the phase of a material layer, such as a GST ($Ge_2Sb_2Te_5$) layer, between a crystalline phase and a non-crystalline phase according to the temperature of the material layer.

The conventional phase changeable memory devices have a structure in which a lower electrode contact directly contacts a phase changeable layer. When a current generated by a transistor flows through a lower electrode contact having a very small area relative to the phase changeable layer, heat is generated at the interface between the phase changeable layer and the lower electrode contact, in turn causing a phase change to occur in the phase changeable layer, since the lower electrode contact functions as a heater. A phase of the phase changeable layer is changed at the interface due to the heat. If the phase is changed, the resistance of the phase changeable layer is likewise changed. It is possible to program the phase changeable memory device by changing the phase of the phase changeable memory device. However, in a conventional structure where the lower electrode contact directly contacts the phase changeable layer, a large amount of current is required at the time of programming. Since thermal conductivity of the phase changeable layer is high, any heat that is present at the interface between the lower electrode contact and the phase changeable layer is output through the phase changeable layer, thereby causing a loss of heat. To achieve a phase change, the temperature at the interface must reach a specific temperature. However, a great deal of current is required for supplementing the lost heat.

For reducing the amount of current required at the time of programming, a conventional phase changeable memory device has a structure whereby an insulating layer is formed on a lower electrode pattern contacting the lower electrode contact and is patterned to form a contact hole in the insulating layer. The contact hole is then filled with a phase changeable layer to contact a portion of the surface of an exposed upper portion of a lower electrode through the contact hole. In the structure, an insulating layer having a low thermal conductivity is located at a lower portion of, and at both sides of an interface where the phase changeable layer contacts the lower electrode pattern, thereby preventing or mitigating heat loss. However, in the above structure of forming a memory device, the etching gas can react with a lower electrode layer to form an undesirable oxide layer and a fluoric layer at the interface, thereby causing a resistor distribution failure. In order to remove the unwanted oxide layer and the fluoric layer, a cleaning process is performed using a radio frequency (RF) plasma. At this time, the insulating layer at inner sidewalls of the contact hole to be filled with a phase changeable layer is etched to increase the width of the contact hole and therefore, the beneficial effects of a reduction in heat or current are decreased.

SUMMARY OF THE INVENTION

It is an object of the present invention to provide a phase changeable memory device in which the occurrence of a distribution failure of a resistor is mitigated or eliminated, and in which program current is effectively reduced, and a method of formation thereof.

In one aspect, the present invention is directed to a phase changeable memory device comprising: an interlayer insulating layer on a semiconductor substrate: a lower electrode pattern on the interlayer insulating layer; an insulating pattern located on the lower electrode pattern; a phase changeable pattern contacting the lower electrode pattern and the interlayer insulating layer through the insulating pattern and the lower electrode pattern; and an upper electrode on the phase changeable pattern.

In one embodiment, the phase changeable memory device further comprises a lower electrode contact electrically connecting the semiconductor substrate with the lower electrode pattern through the interlayer insulating layer, and the phase changeable pattern preferably does not directly contact the lower electrode contact. In another embodiment, the lower electrode pattern directly contacts the lower electrode contact.

In another embodiment, the lower electrode contact may comprise a conductive plug penetrating the interlayer insulating layer.

In another embodiment, the lower electrode contact may comprise a cup-shaped conductive pattern penetrating the interlayer insulating layer. In this case, the interlayer insulating layer comprises: an outer interlayer insulating layer contacting an outer portion of the cup-shaped conductive pattern; and an inner insulating layer contacting an inner portion of the cup-shaped conductive pattern, and wherein the phase changeable pattern contacts the inner interlayer insulating layer.

In another embodiment, the lower electrode pattern comprises a lower conductive plug and a cup-shaped upper conductive pattern located on the lower conductive plug. The interlayer insulating layer comprises: a lower interlayer insulating layer contacting sidewalls of the lower conductive plug; an outer interlayer insulating layer contacting an outer portion of the upper cup-shaped conductive pattern; and an inner interlayer insulating layer contacting an inner portion of the upper cup-shaped conductive layer pattern, and wherein the phase changeable pattern contacts the inner interlayer insulating layer. In another embodiment, a spacer may be further interposed between the insulating pattern and the phase changeable pattern. The lower electrode pattern comprises at least one layer selected from a group consisting of titanium, a titanium nitride layer, a titanium aluminum nitride layer, tantalum, a tantalum nitride layer and a titanium tungsten layer.

In another aspect, the present invention is directed to a phase changeable memory device comprising: a semiconductor substrate; an interlayer insulating layer on the semiconductor substrate; a lower electrode contact comprising a conductive plug electrically contacting the semiconductor substrate through the interlayer insulating layer; a lower electrode pattern over and in contact with the lower electrode contact on the interlayer insulating layer; an insulating pattern having outer sidewalls that are aligned with outer sidewalls of the lower electrode pattern on the lower electrode pattern; a phase changeable pattern having outer sidewalls that are aligned with the sidewalls of the lower electrode pattern on the insulating layer pattern, and contacting the interlayer insulating layer and the lower electrode pattern through an opening in the insulating pattern and the lower electrode pattern; and an upper electrode having outer sidewalls that are aligned with the outer sidewalls of the lower electrode pattern on the phase changeable pattern.

In another aspect, the present invention is directed to a phase changeable memory device comprising: a semiconductor substrate; an outer interlayer insulating layer on the semiconductor substrate; a lower electrode contact comprising a cup-shaped conductive pattern electrically contacting the semiconductor substrate through the outer interlayer insulating layer; an inner interlayer insulating layer filling the inside of the cup-shaped conductive pattern; a lower electrode pattern over and in contact with the lower electrode contact on the inner interlayer insulating layer and the outer interlayer insulating layer; an insulating pattern having outer sidewalls that are aligned with outer sidewalls of the lower electrode pattern on the lower electrode pattern; a phase changeable pattern having outer sidewalls that are aligned with outer sidewalls of the lower electrode pattern on the insulating layer pattern, and contacting the inner interlayer insulating layer and the lower electrode pattern through an opening in the insulating pattern and the lower electrode pattern; and an upper electrode having outer sidewalls that are aligned with the outer sidewalls of the lower electrode pattern on the phase changeable pattern.

In another aspect, the present invention is directed to a phase changeable memory device comprising: a semiconductor substrate; a lower interlayer insulating layer on the semiconductor substrate; a lower conductive plug electrically contacting the semiconductor substrate through the lower interlayer insulating layer; an outer interlayer insulating layer on the lower interlayer insulating layer; a cup-shaped conductive pattern contacting the conductive plug through the outer interlayer insulating layer; an inner interlayer insulating layer filling the inside of the cup-shaped conductive pattern; a lower electrode pattern over and in contact with the cup-shaped conductive pattern on the inner interlayer insulating layer and the outer interlayer insulating layer; an insulating pattern having outer sidewalls that are aligned with outer sidewalls of the lower electrode pattern on the lower electrode pattern; a phase changeable pattern having outer sidewalls that are aligned with outer sidewalls of the lower electrode pattern on the insulating layer pattern, and contacting the inner interlayer insulating layer and the lower electrode pattern through an opening in the insulating pattern and the lower electrode pattern; and an upper electrode having outer sidewalls that are aligned with the outer sidewalls of the lower electrode pattern on the phase changeable pattern.

In one embodiment, the device further comprises a spacer interposed between the insulating pattern and the phase changeable pattern.

In another aspect, the present invention is directed to a method for forming a phase changeable memory device comprising: forming an interlayer insulating layer on a semiconductor substrate; stacking a lower electrode layer and an insulating layer on the interlayer insulating layer; patterning the insulating layer to form a first opening exposing the lower electrode layer; patterning at least a part of the lower electrode layer exposed by the first opening to form the second opening exposing a side surface of the lower electrode layer and a part of a surface of the interlayer insulating layer; providing a phase changeable layer to fill the first opening and the second opening; and forming an upper electrode layer on the phase changeable layer.

In one embodiment, the step of patterning the lower electrode layer to form the second opening is performed using at least one plasma selected from a group consisting of a gas including chlorine (Cl), nitrogen and argon. In another embodiment, the gas including chlorine (Cl) is at least one selected from a group consisting of chlorine gas ($Cl_2$) and boron chloride ($BCl_3$). In another embodiment, it is possible to perform a radio frequency (RF) plasma process with respect to the semiconductor substrate on which the second opening is formed using an inert gas, before forming the phase changeable layer. In another embodiment, the radio frequency (RF) plasma process is performed to remove a silicon oxide layer having a thickness ranging from 30Å to 50Å. In another embodiment, before performing the radio frequency (RF) plasma, a wet cleaning process using at least one solution selected from a group including a deionized water and a fluoride acid with respect to the semiconductor substrate on which the second opening is formed. In another embodiment, if unnecessary oxide layer is removed with the cleaning, the radio frequency (RF) plasma process may be omitted. In another embodiment, a spacer covering the sidewalls of the first opening may be formed, before forming the second opening, and the spacer is used as an etching mask when the second opening is formed.

In another embodiment, it is possible to penetrate the interlayer insulating layer to form a lower electrode contact electrically contacting the semiconductor substrate, before forming the lower electrode layer.

In another embodiment, the step of forming the lower electrode contact comprises: forming an interlayer insulating layer on the semiconductor substrate; patterning the interlayer insulating layer to form a contact hole exposing the semiconductor substrate; and forming a conductive layer to fill the contact hole.

In another embodiment, the method for forming the lower electrode contact comprises: forming an outer interlayer insulating layer on a semiconductor substrate; patterning the outer interlayer insulating layer to form a contact hole exposing the semiconductor substrate; forming a conductive layer conformally covering the sidewalls and a bottom of the contact hole; forming an inner interlayer insulating layer to fill the contact hole; and removing the inner interlayer insulating layer and the conductive layer on the outer interlayer insulating layer by performing a planarization process, and leaving a cup-shaped conductive pattern covering the sidewalls and a bottom of the contact hole in the contact hole at the same time, and wherein the second opening exposes the inner interlayer insulating layer.

In another embodiment, the method for forming the lower electrode comprises: forming a lower interlayer insulating layer on the semiconductor substrate; patterning the lower interlayer insulating layer to form a lower contact hole exposing the semiconductor substrate; stacking a first conductive layer to form a lower conductive plug filling the lower contact hole; forming an outer interlayer insulating layer; patterning the outer interlayer insulating layer to form an upper contact hole exposing the lower conductive plug; forming a second conductive layer conformally covering the sidewalls and a bottom of the upper contact hole; forming an inner interlayer insulating layer to fill the contact hole; and removing the inner interlayer insulating layer and the second conductive layer on the outer interlayer insulating layer by performing a planarization process, and leaving a cup-shaped conductive pattern covering the sidewalls and a bottom of the contact hole in the contact hole at the same time, and wherein the second opening exposes the inner interlayer insulating layer.

In another aspect, the present invention is directed to a method for forming a phase changeable memory device comprising: forming an outer interlayer insulating layer on a semiconductor substrate; patterning the outer interlayer insulating layer to form a contact hole exposing the semiconductor substrate; providing a conductive layer conformally covering the sidewalls and a bottom of the contact hole; providing an inner interlayer insulating layer to fill the contact hole; removing the inner interlayer insulating layer and the conductive layer on the interlayer insulating layer by performing a planarization process to expose the interlayer insulating layer and simultaneously to form a cup-shaped conductive pattern covering the sidewalls and a bottom of the contact hole in the contact hole; providing a lower electrode and an insulating layer on the conductive pattern and inner interlayer insulating layer; patterning the insulating layer to form a first opening exposing the lower electrode layer; patterning at least a part of the lower electrode layer exposed by the first opening to form a second opening exposing the lower electrode layer and the inner interlayer insulating layer; providing a phase changeable layer to fill the first opening and the second opening; and providing an upper electrode layer on the phase changeable layer.

In another aspect, the present invention is directed to a method for forming a phase changeable memory device comprising: forming a lower interlayer insulating layer on a semiconductor substrate; patterning the lower interlayer insulating layer to form a lower contact hole exposing the semiconductor substrate; providing a first conductive layer to form a lower conductive plug filling the lower contact hole; forming an outer interlayer insulating layer; patterning the outer interlayer insulating layer to form an upper contact hole exposing the lower conductive plug; forming a second conductive layer conformally covering the sidewalls and a bottom of the upper contact hole; forming an inner interlayer insulating layer filling the upper contact hole; removing the inner interlayer insulating layer and the conductive layer on the interlayer insulating layer by performing a planarization process to expose the interlayer insulating layer and simultaneously to form a cup-shaped conductive pattern covering the sidewalls and a bottom of the contact hole in the upper contact hole; providing a lower electrode layer and an insulating layer on the conductive pattern and inner interlayer insulating layer; patterning the insulating layer to form a first opening exposing the lower electrode layer; patterning at least a part of the lower electrode layer exposed by the first opening to form a second opening exposing the lower electrode layer and the inner interlayer insulating layer; providing a phase changeable layer to fill the first opening and the second opening; and providing an upper electrode layer on the phase changeable layer.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
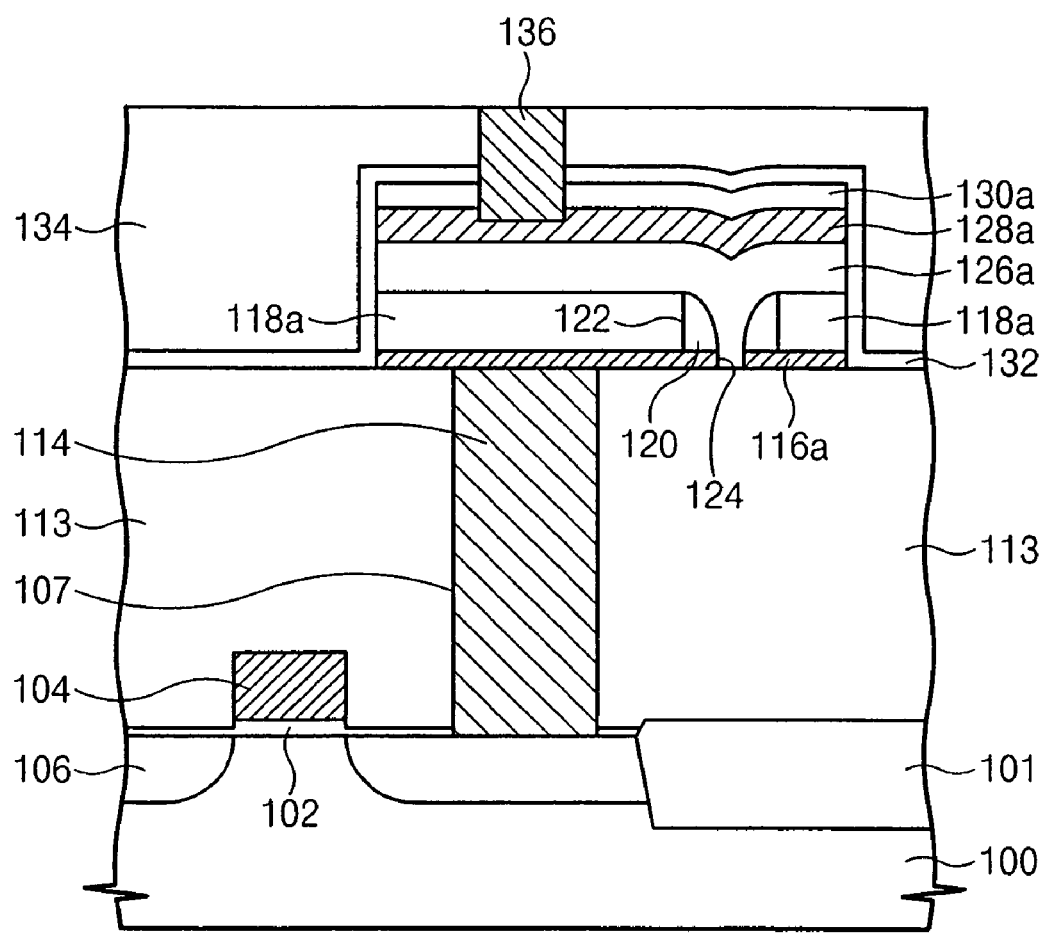
FIG. 1 is a cross-sectional view of a phase changeable memory device in accordance with an embodiment of the present invention.

The present invention will now be described more fully hereinafter with reference to the accompanying drawings, in which preferred embodiments of the invention are shown. This invention may, however, be embodied in different forms and should not be constructed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate or intervening layers may also be present. Like numbers refer to like elements throughout the specification.

FIG. 1 is a cross-sectional view of a phase changeable memory device in accordance with an embodiment of the present invention.

Referring to FIG. 1, a gate electrode 104 is located on a semiconductor substrate 100 on which a device isolation layer 101 is formed with an intervening gate insulating layer 102. An impurity implantation region 106 is located on the semiconductor substrate 100 at both sides of the gate electrode 104. A transistor consists of the gate electrode 104 and the impurity implantation region 106. A lower electrode contact 114 formed of a conductive plug is located to contact the impurity implantation region 106 by penetrating a lower interlayer insulating layer 113 covering the transistor. A sequentially stacked structure of a lower electrode pattern 116a, an insulating pattern 118a, a phase changeable pattern 126a, an upper electrode pattern 128a and a hard mask pattern 130a is located on the lower electrode contact 114 and the lower interlayer insulating layer 113. The lower electrode contact 114 may be formed of a material selected from a group consisting of tungsten, aluminum, copper and polysilicon. The lower electrode pattern 116a may be formed of a material which can endure a high current density and does not react with the phase changeable pattern 126a, preferably at least one layer selected from a group consisting of titanium Ti, a titanium nitride layer TiN, a titanium aluminum nitride layer TiAlN, tantalum Ta, a tantalum nitride layer TaN and a titanium tungsten layer TiW. The hard mask pattern 130a being an insulating layer may be formed of at least one material selected from a group consisting of a silicon oxide layer, a silicon oxide nitride layer, a silicon nitride layer and oxide aluminum.

The insulating pattern 118a has a first opening 122 exposing a part of the lower electrode pattern 116a. The lower electrode pattern 116a has a second opening 124 exposing the lower interlayer insulating layer 113. A spacer 120 covering an inner sidewall of the insulating pattern 118a exposed by the first opening 122 contacts an upper surface of the lower electrode pattern 116a exposed by the first opening 122. The phase changeable pattern 126a contacts a side surface of the lower electrode pattern 116a and an exposed upper surface of the lower interlayer insulating layer 113 through the first opening 122 and the second opening 124.

An upper surface and a sidewall of the hard mask pattern 130a, a sidewall of the upper electrode pattern 128a, a sidewall of the phase changeable pattern 126a, a sidewall of the insulating pattern 118a, a sidewall of the lower electrode pattern 116a and the lower interlayer insulating layer 113 are covered with a protection layer 132. An upper interlayer insulating layer 134 covers the protection layer 132. An upper electrode contact 136 penetrates the upper interlayer insulating layer 134, the protection layer 132 and the hard mask pattern 130a sequentially to electrically contact the upper electrode pattern 128a.

According to the structure shown in FIG. 1, an interface where the phase changeable pattern 126a contacts the lower electrode pattern 116a has an annular structure along a sidewall of the lower electrode pattern 116a exposed by the second opening 124. A lower portion of the interface contacts the interlayer insulating layer 113, and an upper portion of the interface contacts the insulative spacer 120. The spacer 120 is surrounded by the insulating pattern 118a. When the phase changeable memory device according to the present invention is programmed, a current occurring in the transistor flows through the lower electrode contact 114 and the lower electrode pattern 116a to generate heat due to an interfacial resistance that is present at the interface. Therefore, a phase changeable program region is formed at the interface region. As described above, the upper portion and the lower portion of the interface contact the insulating pattern 118a, the lower interlayer insulating layer 113 and the spacer 120, all having relatively low thermal conductivity, thus they provide a suitable insulating effect. Accordingly, in this manner, it is possible to effectively program the memory device using a small amount of current. In addition, if the lower electrode pattern 116a is formed to be relatively thin, heat generation is increased due to a corresponding increase in resistance that results from a decrease in the area of the junction area and from the presence of the insulating layers surrounding the junction area. Thus, heat loss is more effectively reduced, and program current can be effectively decreased.

FIGS. 2 to 7 sequentially illustrate a method for forming the phase changeable memory device shown in FIG. 1, in accordance with the present invention.

Figure 2:
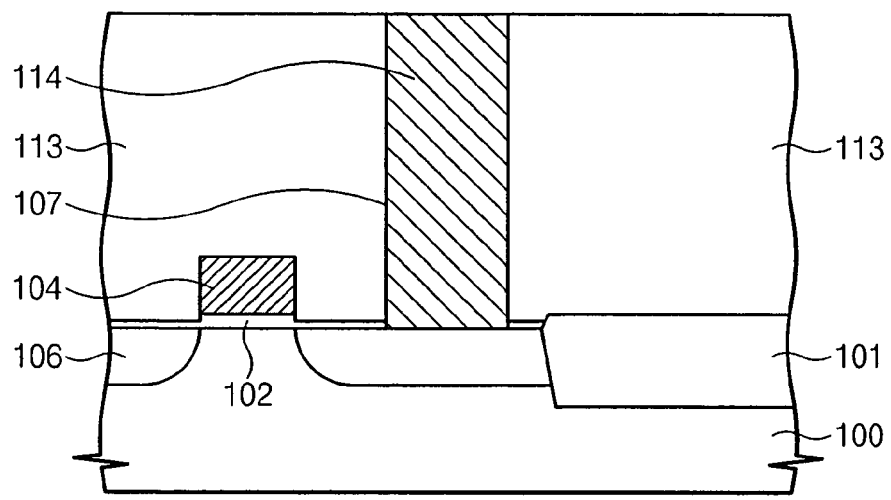
FIGS. 2 through 7 sequentially illustrate a method for forming a phase changeable memory device, in accordance with the present invention.

Referring to FIG. 2, a gate insulating layer 102 is formed on the semiconductor substrate 100, for example, using a thermal oxidation process or a chemical vaporization deposition process. A gate electrode layer is stacked on the gate insulating layer 102 to form a gate electrode 104 by patterning at least the gate electrode layer. The impurity implantation regions 106 are formed by implanting impurity ions at an active region of the semiconductor substrate 100 at both sides of the gate electrode 104 using the gate electrode 104 as an ion implantation mask. A lower interlayer insulating layer 113 is formed on the semiconductor substrate 100. The lower interlayer insulating layer 113 is patterned to form a contact hole 107 exposing the impurity implantation region 106. A conductive layer is stacked on the semiconductor substrate on which the contact hole 107 is formed to fill the contact hole 107. The lower interlayer insulating layer 113 is exposed by performing a planarization process with respect to the conductive layer, and a lower plug-shaped electrode contact 114 formed of the conductive layer is formed in the contact hole 107.

Figure 3:
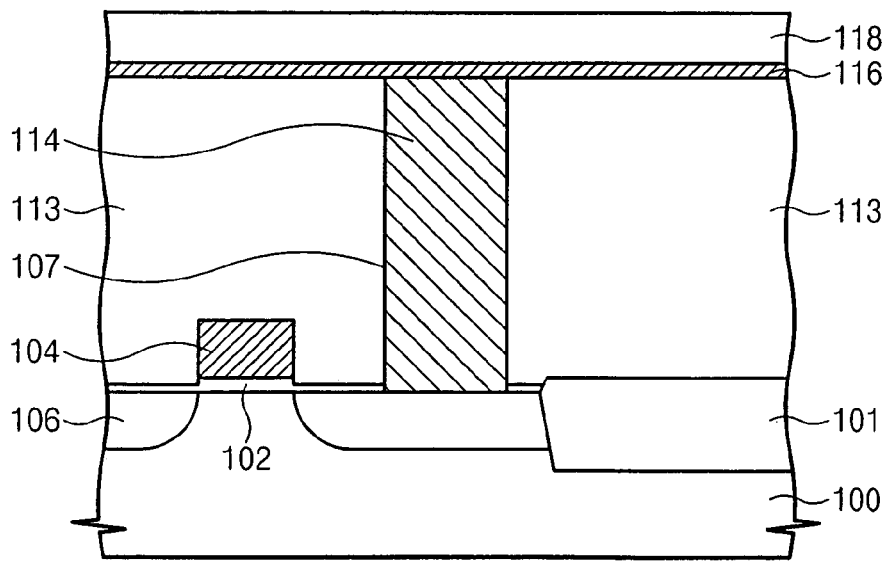

Referring to FIG. 3, a lower electrode layer 116 and an insulating layer 118 are sequentially formed on a front surface of the semiconductor substrate 100 on which the lower electrode contact 114 is formed. The lower electrode layer may be formed of a material which does not react with a subsequent phase changeable layer, and can endure a high current density, for example, at least one material selected from a group consisting of titanium Ti, a titanium nitride layer TiN, a titanium aluminum nitride layer TiAlN, tantalum Ta, a tantalum nitride layer TaN and a titanium tungsten layer TiW. The insulating layer 118 may be formed of at least one material selected from a group consisting of a silicon oxide layer, a silicon oxide nitride layer, a silicon nitride layer, a titanium oxide layer and oxide aluminum.

Figure 4:
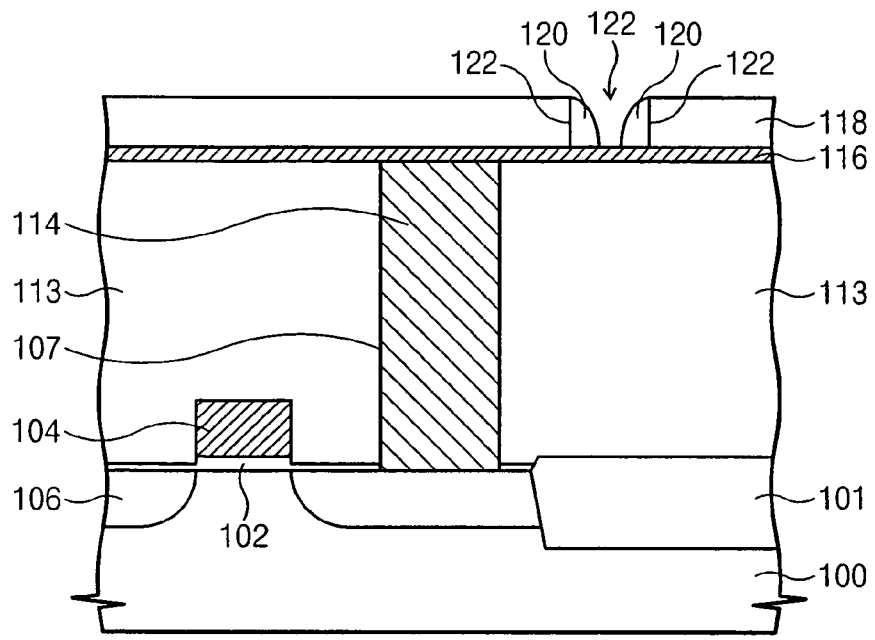

Referring to FIG. 4, the insulating layer 118 is patterned to form a first opening 122 exposing the lower electrode layer 116. At this time, the first opening 122 dose not overlap with the lower electrode contact 114, and is formed over the lower interlayer insulating layer 113. A spacer layer is formed on a front surface of the semiconductor substrate, and an anisotropic etching process is performed using a fluorine containing gas. Therefore, a spacer 120 covering an inner sidewall of the insulating layer 118 exposed by the first opening, and exposing a part of the lower electrode layer 118 is formed. At this time, the etching gas reacts with the lower electrode layer 116 on a surface of the exposed lower electrode layer 116 to form a titanium oxide layer and a titanium fluoric layer. If the titanium oxide layer and the titanium fluoric layer remain, a problem such as a distribution failure of a resistor may occur. The spacer may be formed of at least one material selected from a group consisting of a silicon oxide layer, a silicon oxide nitride layer, a silicon nitride layer, a titanium oxide layer and oxide aluminum.

Figure 5:
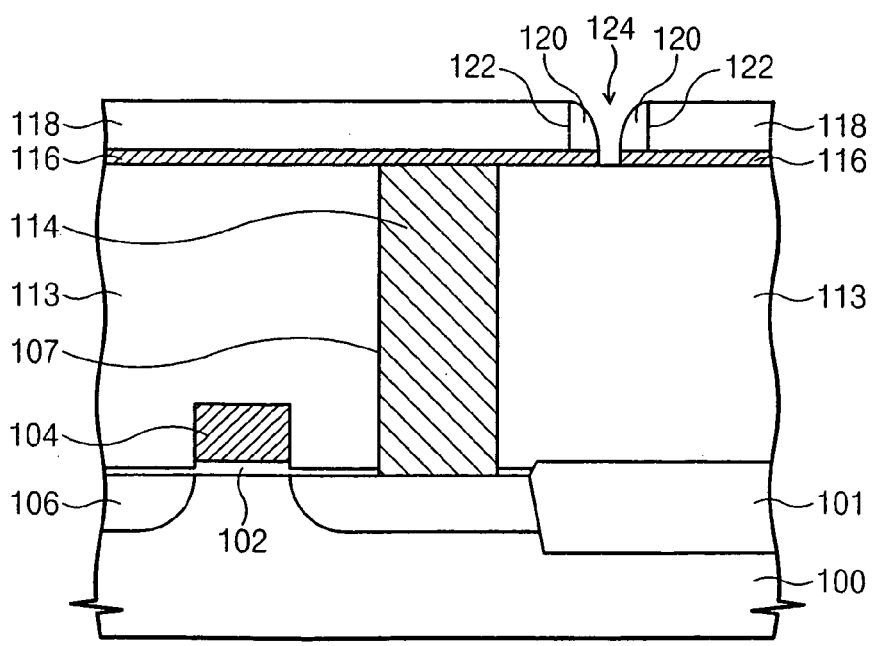

Referring to FIG. 5, the exposed lower electrode layer 116 is etched to form a second opening 124 exposing the lower interlayer insulating layer 113 using the spacer layer 120 and the insulating layer 118 as an etching mask. The second opening 124 is formed so as not to expose the lower electrode contact 114. A titanium oxide layer and a titanium fluoric layer formed on a surface of the exposed lower electrode layer 116 are removed during the etching process. The etching process is performed using at least one plasma selected from a group consisting of a gas including chlorine (cl) atom, nitrogen and argon. At this time, the gas including chlorine (Cl) may be at least one selected from a group consisting of chlorine (Cl) and boron chloride ($BCl_3$). Subsequently, a wet cleaning process may be performed using at least one solution selected from a group consisting of a deionized water and a fluoric acid. Furthermore, a dry cleaning process can be performed with respect to the semiconductor substrate on which the second opening is formed using a radio frequency (RF) plasma using an inactive gas. Preferably, the radio frequency (RF) plasma process is performed for a time required for removing with a thickness ranging from 30 to 50Å. If an unnecessary oxide layer is removed with the etching cleaning method, the radio frequency (RF) plasma process may optionally be omitted. If an etching process is performed using the gas including a chlorine atom, $TiCl_4$ may be formed on a surface of the lower electrode layer 116 exposed to the second opening 124 and a surface of the lower interlayer insulating layer 113, but it can be readily removed during the RF plasma process.

Figure 6:
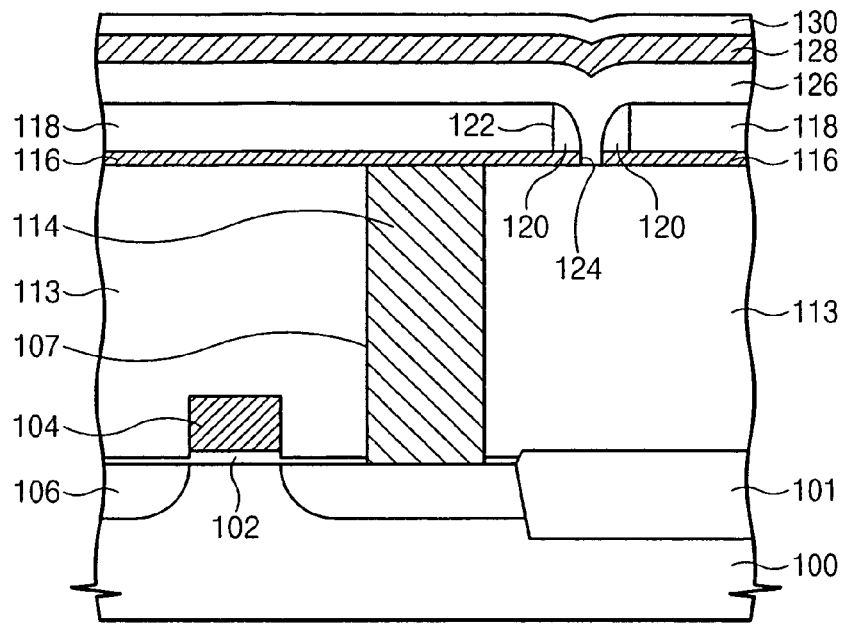

Referring to FIG. 6, a phase changeable layer 126, an upper electrode layer 128 and a hard mask layer 130 are sequentially formed on a front surface of the semiconductor substrate 100, on which the second opening is formed. The phase changeable layer 126 fills the second opening 116 to contact a sidewall of the exposed lower electrode layer 116 and an upper surface of the exposed lower interlayer insulating layer 113. At this time, as the conventional oxide layer and fluoric layer do not exist at the interface where the sidewall of the lower electrode layer 116 contacts the upper surface of the lower interlayer insulating layer 113, the distribution failure of the resistor associated with the conventional approach discussed above does not occur. The phase changeable layer 126 can comprise, in one example, a GST ($Ge_2Sb_2Te_5$) layer doped with nitrogen or not doped with nitrogen. The upper electrode layer 128 may be formed of at least one material selected from a group consisting of titanium Ti, a titanium nitride layer TiN, a titanium aluminum nitride layer TiAlN, tantalum Ta, a tantalum nitride layer TaN and a titanium tungsten layer TiW. The hard mask layer 130 may be formed of at least one material selected from a group consisting of a silicon oxide layer, a silicon oxide nitride layer, a silicon nitride layer and oxide aluminum.

Figure 7:
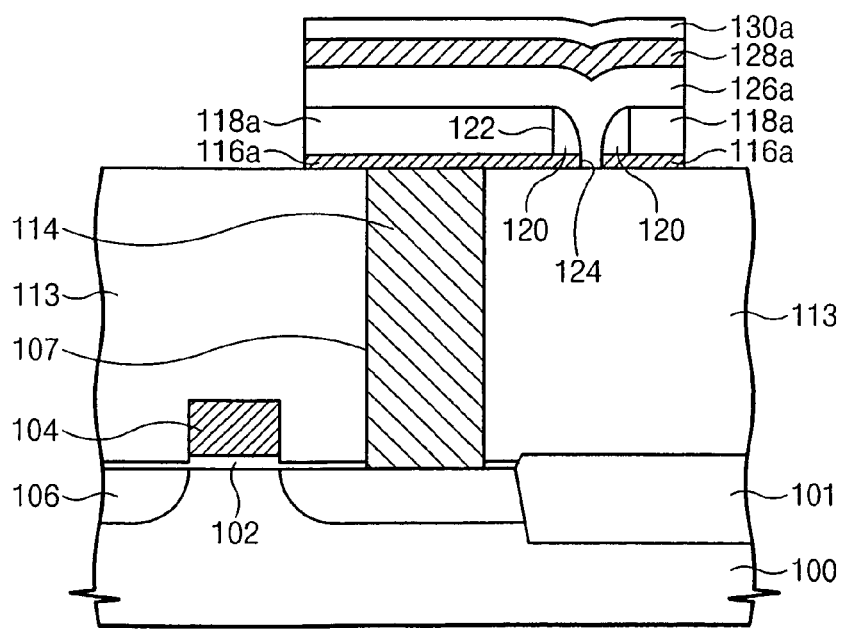

Referring to FIG. 7, the hard mask layer 130, the upper electrode layer 128, the phase changeable layer 126, the insulating layer 118 and the lower electrode layer 116 are sequentially patterned to expose the lower interlayer insulating layer 113 and to form a lower electrode pattern 116a, an insulating pattern 118a, an upper electrode pattern 128a and a hard mask pattern 130a, which are sequentially stacked. In the embodiment shown, the patterns 130a, 128a, 126a, 118a and 116a have sidewalls that are aligned with each other, and with the lower electrode contact 114.

Figure 8:
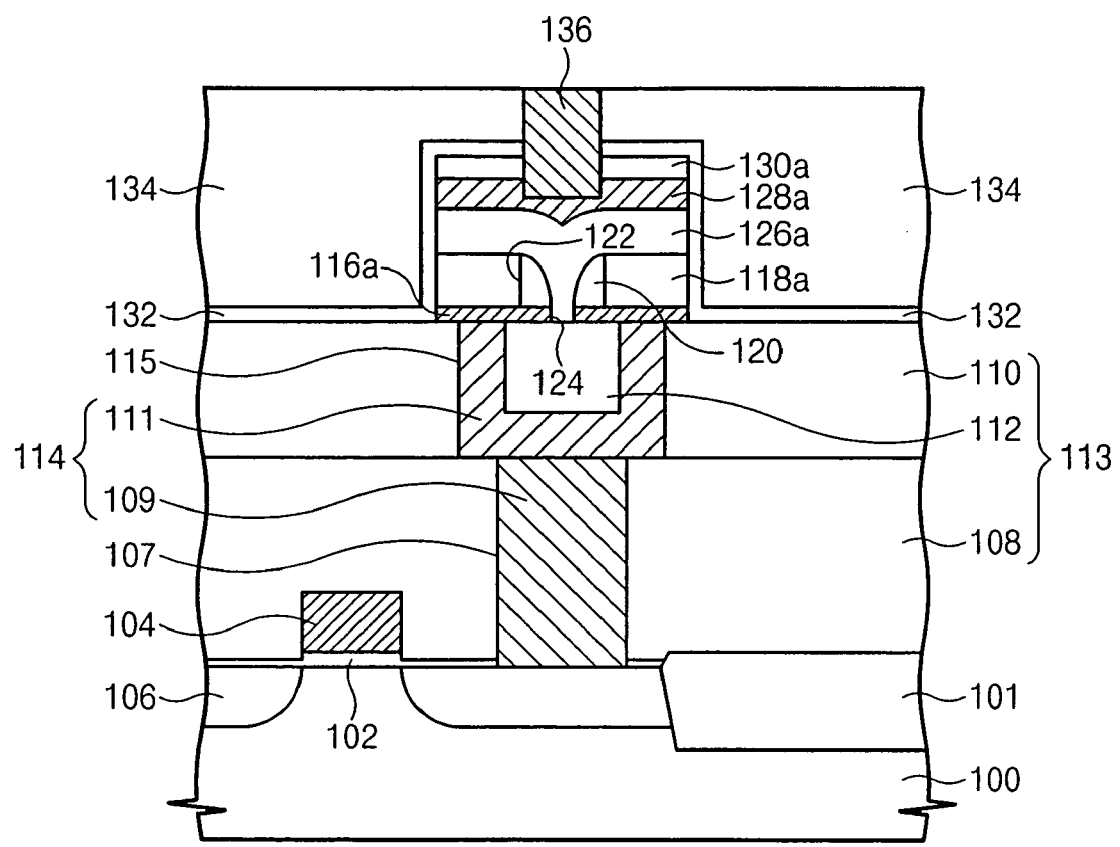
FIG. 8 is a cross-sectional view of a phase changeable memory device in accordance with another embodiment of the present invention.

FIG. 8 is a cross-sectional view of a phase changeable memory device in accordance with another embodiment of the present invention.

Referring to FIG. 8, a lower interlayer insulating layer 108 is positioned to cover a transistor consisting of a gate insulating layer 102, a gate electrode 104 and an impurity implantation region 106. The lower conductive plug 109 penetrates the lower interlayer insulating layer 108 to fill a lower contact hole 107 exposing the impurity implantation region 106. An outer interlayer insulating layer 110 is located on the lower interlayer insulating layer 108. The outer interlayer insulating layer 110 has an upper contact hole 115 exposing the lower conductive plug 109. The conductive pattern 111 has a cup-shaped covering a bottom and a sidewall of the upper contact hole 115. The inner interlayer insulating layer 112 is located in the inside of the cup-shaped conductive pattern 111 to fill the inside of an cup-shaped conductive pattern 111 formed in the contact hole 115. The lower interlayer insulating layer 113 consists of the lower interlayer insulating layer 108, the outer interlayer insulating layer 110 and the inner interlayer insulating layer 112. The lower electrode contact 114 consists of the lower conductive plug 109 and the upper cup-shaped conductive pattern 111.

A lower electrode pattern 116a is located to contact an upper cup-shaped conductive pattern 111 of the lower electrode contact 114 on the inner interlayer insulating layer 112 and the outer interlayer insulating layer 110. An insulating pattern 118a, a phase changeable pattern 126a, an upper electrode pattern 128a and a lower hard mask pattern 130a are sequentially stacked on the lower electrode pattern 116a and have sidewalls that are aligned with each other. The phase changeable pattern 126a contacts an upper surface of the inner interlayer insulating layer 112 and a sidewall of the lower electrode pattern 116a through the first opening 122 and the second opening 124. The first and the second openings 122 and 124 overlap with the lower electrode contact 114. Accordingly, the structure shown in FIG. 8 has the advantage of decreasing the horizontal size of a unit cell in comparison with the structure shown above in FIG. 1.

FIGS. 9 to 12 sequentially illustrate a method for forming a phase changeable memory device shown in FIG. 8.

Figure 9:
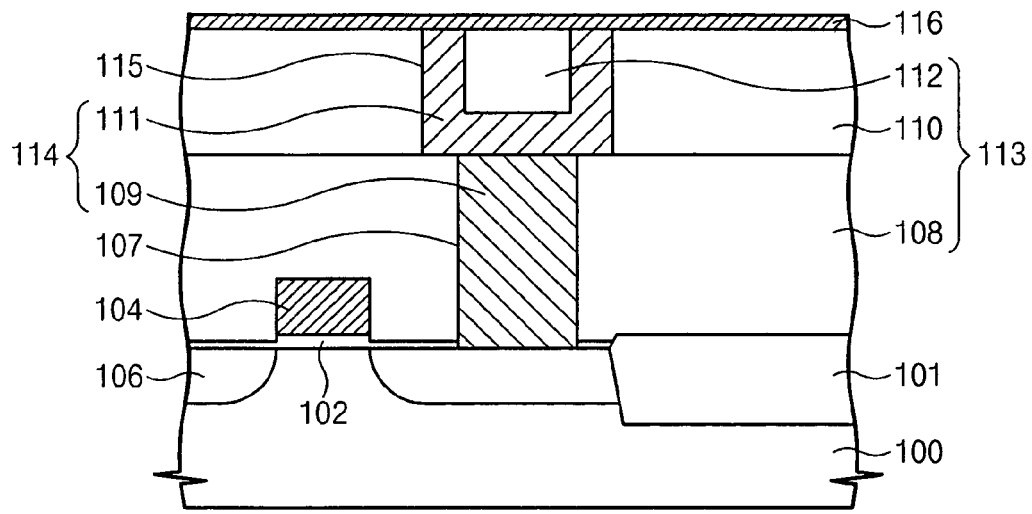
FIGS. 9 through 12 sequentially illustrate a method for forming a phase changeable memory device shown in FIG. 8.

Referring to FIG. 9, a lower interlayer insulating layer 108 is formed and patterned to form a lower contact hole 107 exposing an impurity implantation region 106 of the lower transistor that is formed as shown in FIG. 2. A conductive layer is stacked to form a lower conductive plug 109 filling the lower contact hole 107. An outer interlayer insulating layer 110 is stacked on a front surface of the semiconductor substrate 100 on which the lower conductive plug 109 is formed. The outer interlayer insulating layer 110 is patterned to form an upper contact hole 115 exposing the lower conductive plug 109. A conductive layer is conformally formed to cover a sidewall and a bottom of the upper contact hole 115. In addition, the inner interlayer insulating layer 112 is stacked to fill the upper contact hole 115. A planarization process is performed to expose the outer interlayer insulating layer, and to leave an upper conductive pattern 111 covering a sidewall and a bottom of the upper contact hole 115 and the inner interlayer insulating layer 112 in the upper contact hole 115. A lower electrode layer 116 is then formed on the planarized structure.

Figure 10:
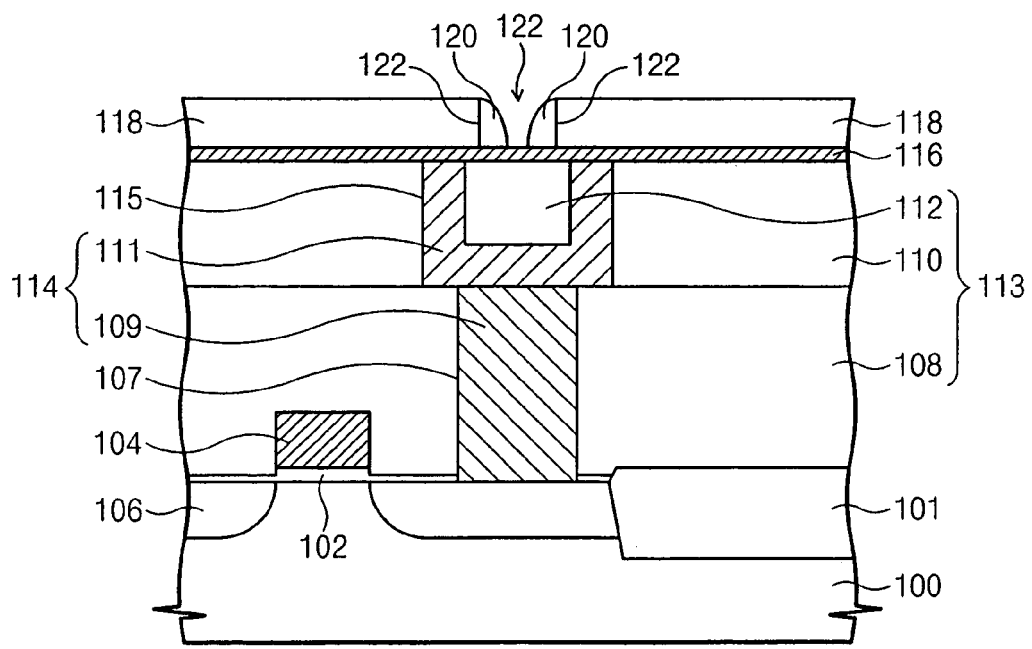

Referring to FIG. 10, the insulating layer 118 is stacked and patterned to form a first opening 122 exposing the lower electrode layer 116 on the inner interlayer insulating layer 112. In addition, a spacer layer is formed and anisotropically etched to form a spacer 120 covering an inner sidewall of the insulating layer 118 exposed by the first opening 122.

Figure 11:
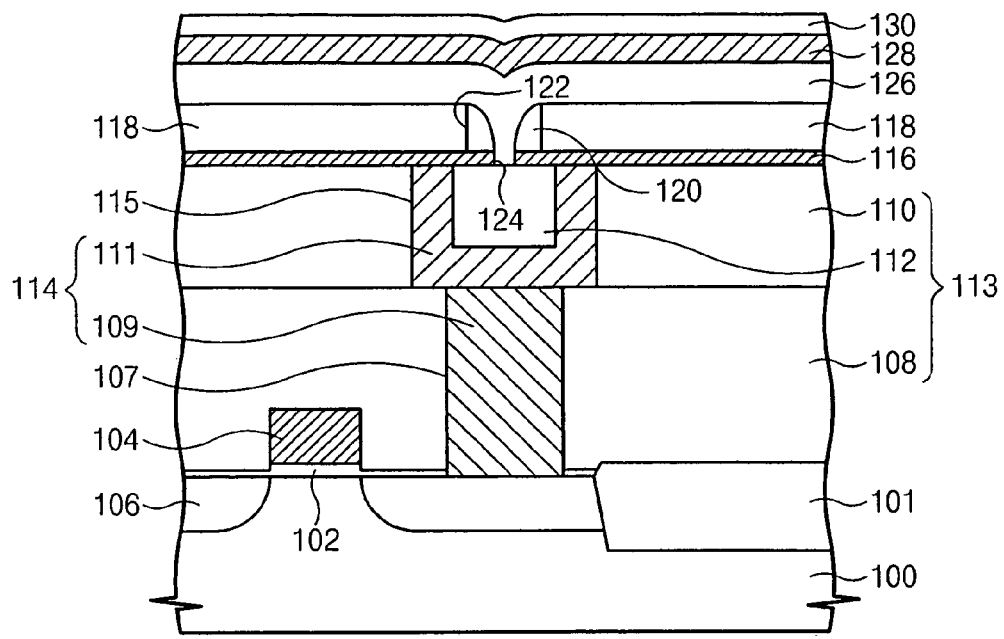

Referring to FIG. 11, the exposed lower electrode layer 116 is patterned using the insulating layer 118 and the spacer 120 as an etching mask to form a second opening 124 exposing a part of an upper surface of the inner interlayer insulating layer 112. A phase changeable layer 126, an upper electrode layer 128 and a hard mask layer 130 are sequentially stacked. The phase changeable layer 126 is formed so that a sidewall of the lower electrode layer 116 contacts a portion of an exposed upper surface of the inner interlayer insulating layer 112 at the second opening 124.

Figure 12:
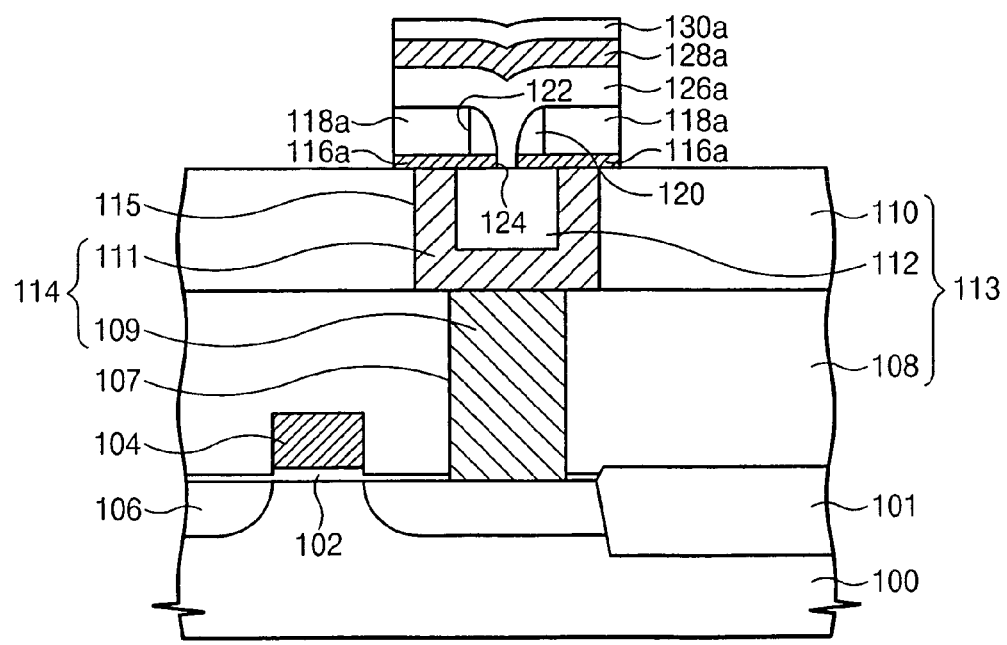

Referring to FIG. 12, the hard mask layer 130, the upper electrode layer 128, the phase changeable layer 126, the insulating layer 118 and the lower electrode layer 116 are sequentially patterned to expose the lower interlayer insulating layer 113, and to form a lower electrode pattern 116a, an insulating pattern 118a, an upper electrode pattern 128a and a hard mask pattern 130a, which are sequentially stacked. The patterns 130a, 126a, 118a and 116a have sidewalls that are aligned with one another, and overlap with the lower electrode contact 109.

Figure 13:
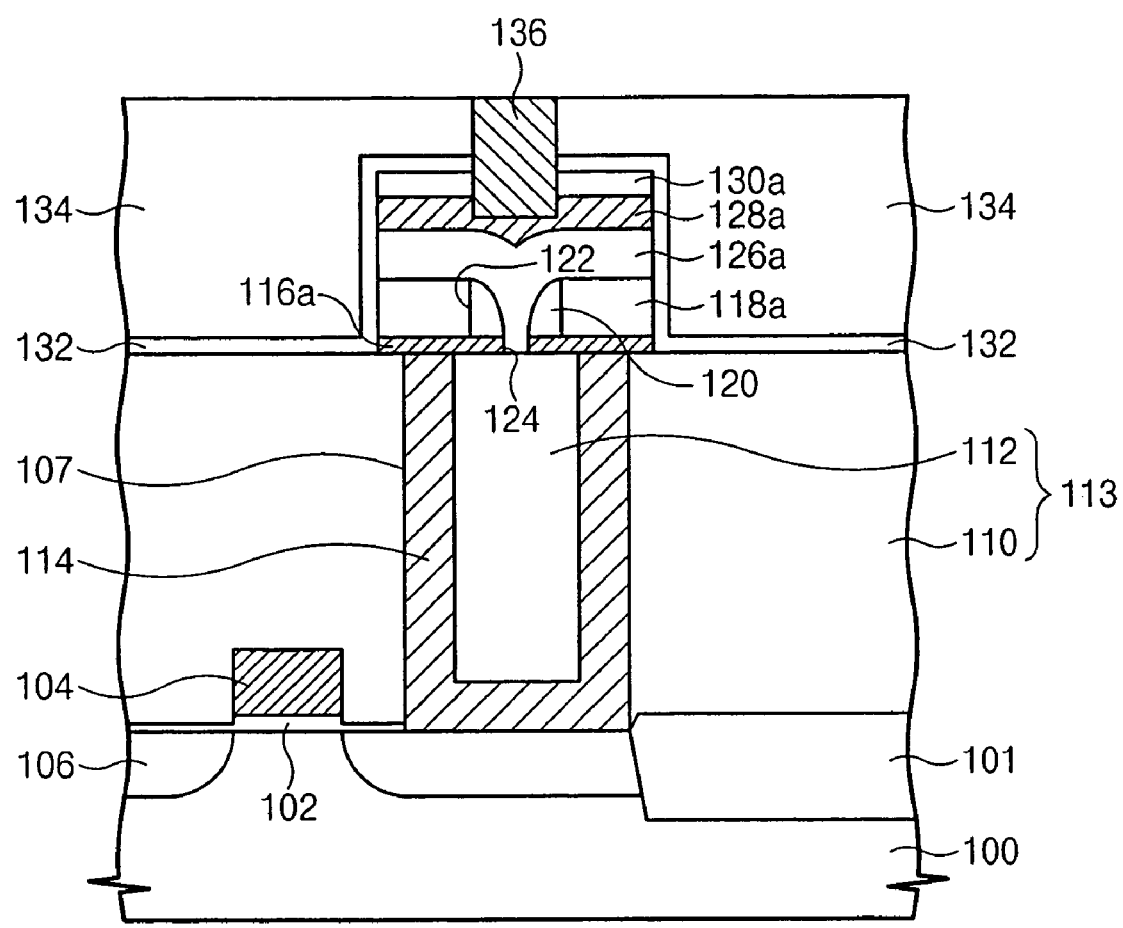
FIG. 13 is a cross-sectional view of a phase changeable memory device in accordance with another embodiment of the present invention.

FIG. 13 is a cross-sectional view of a phase changeable memory device in accordance with another embodiment of the present invention.

Referring to FIG. 13, a lower cup-shaped electrode contact 114 penetrates an outer interlayer insulating layer 110 to expose an impurity implantation region 106. An inner interlayer insulating layer 112 fills the inside of the lower electrode contact 114 in a cup shape. A lower interlayer insulating layer 113 consists of the inner interlayer insulating layer 112 and the outer interlayer insulating layer 110. A phase changeable pattern 126a contacts a sidewall of a lower electrode pattern 116a and a part of an upper surface of the exposed inner interlayer insulating layer 112 through the second opening 124. The structure shown in FIG. 13 can further decrease the horizontal span of a unit cell in comparison with the structure shown in FIG. 1, and has a relatively simple lower electrode contact structure in comparison with the structure shown in FIG. 8. A method for forming a phase changeable memory device shown in FIG. 13 is the same as the method for forming a phase changeable memory device shown in FIG. 8, except for the step for forming a lower interlayer insulating layer and a lower conductive plug shown in FIG. 9.

Accordingly, in accordance with a phase changeable memory device and a method thereof according to the present invention, an insulating layer is located at an upper portion and at a lower portion of the interface where the phase changeable layer contacts a lower electrode layer, thereby increasing a heat insulating effect, and thereby decreasing the program current required for inducing a phase change. In addition, heat generation can be increased due to an increase in resistance in accordance with a decrease of a thickness of the lower electrode layer. Since the interface of the sidewalls of a phase changeable layer and a lower electrode layer has a circular, or annular structure, heat generated from the interface is concentrated at a center portion of the phase change material in the interface region, therefore, a phase change is effectively induced, and the device is therefore effectively programmed. Furthermore, as the lower electrode layer is patterned to form an opening exposing the interlayer insulating layer, it is possible to prevent distribution failure of the resistor by removing an oxide layer and a fluoric layer at the surface of the lower electrode layer, thereby providing a reliable phase changeable memory device.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method for forming a phase changeable memory device comprising:
   forming an interlayer insulating layer on a semiconductor substrate;
   providing a lower electrode layer and an insulating layer on the interlayer insulating layer;
   patterning the insulating layer to form a first opening exposing the lower electrode layer;
   patterning at least a part of the lower electrode layer exposed by the first opening to form a second opening exposing the lower electrode layer and the interlayer insulating layer;
   providing a resistive layer to fill the first opening and the second opening; and
   providing an upper electrode layer on the resistive layer; and
   performing a radio frequency (RF) plasma process with respect to the semiconductor substrate having the second opening using an inert gas, before providing the resistive layer.

2. The method of claim 1, wherein the step of patterning the lower electrode layer to form the second opening is performed using at least one plasma selected from a group consisting of a gas including chlorine (Cl), nitrogen and argon.

3. The method of claim 2, wherein the gas including chlorine (Cl) is at least one selected from a group consisting of chlorine gas ($Cl_2$) and boron chloride ($BCl_3$).

4. The method of claim 1, further comprising forming a spacer covering the sidewalls of the first opening, before forming the second opening, and wherein the spacer is used as an etching mask when the second opening is formed.

5. The method of claim 1, further comprising forming a lower electrode contact electrically contacting the semiconductor substrate through the interlayer insulating layer, and wherein the step of forming the lower electrode contact comprises:
   patterning the interlayer insulating layer to form a contact hole exposing the semiconductor substrate; and
   forming a conductive layer to fill the contact hole.

6. The method of claim 1, further comprising a step of forming a lower electrode contact electrically contacting the semiconductor substrate through the interlayer insulating layer, and wherein the step of forming the lower electrode contact comprises:
   patterning the interlayer insulating layer to form a contact hole exposing the semiconductor substrate;
   forming a conductive layer conformally covering the sidewalls and a bottom of the contact hole;
   forming an inner interlayer insulating layer to fill the contact hole; and
   removing the inner interlayer insulating layer and the conductive layer on the interlayer insulating layer by performing a planarization process to expose the interlayer insulting layer and simultaneously to form a cup-shaped conductive pattern covering the sidewalls and a bottom of the contact hole in the contact hole, wherein the second opening exposes the inner interlayer insulating layer.

7. The method of claim 2, further comprising forming a lower electrode contact electrically contacting the semiconductor substrate through the interlayer insulating layer, and wherein the step of forming the lower electrode contact comprises:
   patterning the interlayer insulating layer to form a lower contact hole exposing the semiconductor substrate;
   stacking a first conductive layer to form a lower conductive plug filling the lower contact hole;
   forming an outer interlayer insulating layer;
   patterning the outer interlayer insulating layer to form an upper contact hole exposing the lower conductive plug;
   forming a second conductive layer conformally covering the sidewalls and a bottom of the upper contact hole;
   forming an inner interlayer insulating layer to fill the contact hole; and
   removing the inner interlayer insulating layer and the conductive layer on the interlayer insulating layer by performing a planarization process to expose the interlayer insulating layer and simultaneously to form a cup-shaped conductive pattern covering the sidewalls and a bottom of the contact hole in the contact hole, and wherein the second opening exposes the inner interlayer insulating layer.

8. A method of forming the phase changeable memory device comprising:
   forming an interlayer insulating layer on a semiconductor substrate;
   patterning the interlayer insulating layer to form a contact hole exposing the semiconductor substrate;
   providing a conductive layer to form a lower electrode contact comprising a conductive plug filling the contact hole;
   providing a lower electrode layer and an insulating layer on the interlayer insulating layer and lower electrode layer;

patterning the insulating layer to form a first opening exposing the lower electrode layer;

patterning at least a part of the lower electrode layer exposed by the first opening to form a second opening exposing the lower electrode layer and the interlayer insulating layer;

providing a resistive layer to fill the first opening and the second opening; and providing an upper electrode layer on the resistive layer; and performing a radio frequency (RF) plasma process with respect to the semiconductor substrate having the second opening using an inert gas, before the resistive layer is formed.

9. The method of claim 8, wherein the step of patterning the lower electrode layer to form a second opening is performed using at least one plasma selected from a group consisting of a gas including chlorine (Cl), nitrogen and argon.

10. The method of claim 9, wherein the gas including chlorine (Cl) is at least one selected from a group consisting of chlorine gas ($Cl_2$) and boron chloride ($BCl_3$).

11. The method of claim 8, wherein the radio frequency (RF) plasma process is performed to remove a silicon oxide layer having a thickness ranging from 30Å to 50Å.

12. The method of claim 8, further comprising forming a spacer covering the sidewalls of the first opening, before the second opening is formed, and wherein the spacer is used as an etching mask when the second opening is formed.

13. A method of forming a phase changeable memory device comprising:

forming an interlayer insulating layer on a semiconductor substrate;

patterning the interlayer insulating layer to form a contact hole exposing the semiconductor substrate;

providing a conductive layer to form a lower electrode contact comprising a conductive plug filling the contact hole;

providing a lower electrode layer and an insulating layer on the interlayer insulating layer and lower electrode layer;

patterning the insulating layer to form a first opening exposing the lower electrode layer;

patterning at least a part of the lower electrode layer exposed by the first opening to form a second opening exposing the lower electrode layer and the interlayer insulating layer;

providing a resistive layer to fill the first opening and the second opening; and providing an upper electrode layer on the resistive layer; and carrying out a wet cleaning process using at least one solution selected from a group including a deionized water and a fluoride acid with respect to the semiconductor substrate on which the second opening is formed.

14. A method for forming a phase changeable memory device comprising:

forming an outer interlayer insulating layer on a semiconductor substrate; patterning the outer interlayer insulating layer to form a contact hole exposing the semiconductor substrate;

providing a conductive layer conformally covering the sidewalls and a bottom of the contact hole;

providing an inner interlayer insulating layer to fill the contact hole;

removing the inner interlayer insulating layer and the conductive layer on the interlayer insulating layer by performing a planarization process to expose the interlayer insulating layer and simultaneously to form a cup-shaped conductive pattern covering the sidewalls and a bottom of the contact hole in the contact hole;

providing a lower electrode and an insulating layer on the conductive pattern and inner interlayer insulating layer;

patterning the insulating layer to form a first opening exposing the lower electrode layer;

patterning at least a part of the lower electrode layer exposed by the first opening to form a second opening exposing the lower electrode layer and the inner interlayer insulating layer;

providing a phase changeable layer to fill the first opening and the second opening; and providing an upper electrode layer on the phase changeable layer.

15. A method for forming a phase changeable memory device comprising:

forming a lower interlayer insulating layer on a semiconductor substrate;

patterning the lower interlayer insulating layer to form a lower contact hole exposing the semiconductor substrate;

providing a first conductive layer to form a lower conductive plug filling the lower contact hole;

forming an outer interlayer insulating layer;

patterning the outer interlayer insulating layer to form an upper contact hole exposing the lower conductive plug;

forming a second conductive layer conformally covering the sidewalls and a bottom of the upper contact hole;

forming an inner interlayer insulating layer filing the upper contact hole;

removing the inner interlayer insulating layer and the conductive layer on the interlayer insulating layer by performing a planarization process to expose the interlayer insulating layer and simultaneously to form a cup-shaped conductive pattern covering the sidewalls and a bottom of the contact hole in the upper contact hole;

providing a lower electrode layer and an insulating layer on the conductive pattern and inner interlayer insulating layer;

patterning the insulating layer to form a first opening exposing the lower electrode layer;

patterning at least a part of the lower electrode layer exposed by the first opening to form a second opening exposing the lower electrode layer and the inner interlayer insulting layer;

providing a phase changeable layer to fill the first opening and the second opening; and providing an upper electrode layer on the phase changeable layer.

16. A method of forming a phase changeable memory device comprising:

providing a lower electrode layer and an insulating layer on an interlayer insulating layer;

patterning the insulating layer to form a first opening that exposes the lower electrode layer;

patterning at least part of the lower electrode layer exposed by the first opening to form a second opening penetrating the lower electrode layer;

performing a cleaning process with respect to the semiconductor substrate having the second opening;

providing a resistive layer to fill the first opening and the second opening; and providing an upper electrode layer on the resistive layer.

17. The method of claim 16, wherein the cleaning process is performed before providing the resistive layer.

18. The method of claim 16, wherein the cleaning process is at least one selected from a group consisting of a wet cleaning process, a dry cleaning process, and a combination of the wet cleaning process and the dry cleaning process.

19. The method of claim 16, wherein the wet cleaning process uses at least one solution selected from a group including the deionized water and a fluoride acid.

20. The method of claim 16, wherein the wet cleaning process comprises performing a radio frequency (RF) plasma process using an inert gas.

* * * * *

UNITED STATES PATENT AND TRADEMARK OFFICE
CERTIFICATE OF CORRECTION

PATENT NO.        : 7,419,881 B2                                      Page 1 of 1
APPLICATION NO.   : 11/252807
DATED             : September 2, 2008
INVENTOR(S)       : Byeong-Ok Cho et al.

It is certified that error appears in the above-identified patent and that said Letters Patent is hereby corrected as shown below:

Column 14, line 29 delete "filing" and insert --filling--

Column 14, line 45 delete "insulting" and insert --insulating--

Signed and Sealed this

Tenth Day of February, 2009

JOHN DOLL
*Acting Director of the United States Patent and Trademark Office*